US010720336B2

(12) United States Patent
Gallagher et al.

(10) Patent No.: US 10,720,336 B2
(45) Date of Patent: Jul. 21, 2020

(54) METHOD FOR MANUFACTURING A MASK

(71) Applicants: IMEC VZW, Leuven (BE); Katholieke Universiteit Leuven, KU LEUVEN R&D, Leuven (BE)

(72) Inventors: Emily Gallagher, Burlington, VT (US); Roel Gronheid, Huldenberg (BE); Jan Doise, Leuven (BE); Iacopo Mochi, Leuven (BE)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 197 days.

(21) Appl. No.: 16/117,480

(22) Filed: Aug. 30, 2018

(65) Prior Publication Data
US 2019/0074186 A1  Mar. 7, 2019

(30) Foreign Application Priority Data

Sep. 6, 2017 (EP) ..................................... 17189717

(51) Int. Cl.
*H01L 21/308* (2006.01)
*H01L 21/027* (2006.01)
(Continued)

(52) U.S. Cl.
CPC ............ *H01L 21/3086* (2013.01); *G03F 1/36* (2013.01); *G03F 1/68* (2013.01); *G03F 7/0002* (2013.01);
(Continued)

(58) Field of Classification Search
CPC ............ H01L 21/3086; H01L 21/3088; H01L 21/0274; G03F 1/68; G03F 1/36; G03F 7/0002; G03F 7/11
See application file for complete search history.

(56) References Cited

U.S. PATENT DOCUMENTS 9,005,756 B2  4/2015 Kim et al.
9,437,452 B2  9/2016 Park et al.
(Continued)

FOREIGN PATENT DOCUMENTS

JP  2014-090029 A  5/2014

OTHER PUBLICATIONS

European Search Report, European Patent Application No. 17189717.6, dated Mar. 15, 2018, 7 pages.
(Continued)

*Primary Examiner* — Stewart A Fraser
(74) *Attorney, Agent, or Firm* — McDonnell Boehnen Hulbert & Berghoff LLP

(57) ABSTRACT

A mask structure and a method for manufacturing a mask structure for a lithography process is provided. The method includes providing a substrate covered with an absorber layer on a side thereof; providing a patterned layer over the absorber layer, the patterned layer comprising at least one opening; and forming at least one assist mask feature in the at least one opening, wherein the at least one assist mask feature is formed by performing a directed self-assembly (DSA) patterning process comprising providing a BCP material in the at least one opening and inducing phase separation of a BCP material into a first component and a second component, the first component being the at least one assist mask feature and being periodically distributed with respect to the second component.

20 Claims, 6 Drawing Sheets

(51) Int. Cl.
*G03F 7/11* (2006.01)
*G03F 7/00* (2006.01)
*G03F 1/36* (2012.01)
*G03F 1/68* (2012.01)
*C09D 153/00* (2006.01)

(52) U.S. Cl.
CPC ............ *G03F 7/11* (2013.01); *H01L 21/0274* (2013.01); *H01L 21/3088* (2013.01); *C09D 153/005* (2013.01)

(56) References Cited

U.S. PATENT DOCUMENTS

| | | |
|---|---|---|
| 9,523,917 B2 | 12/2016 | Ban et al. |
| 2011/0209106 A1 | 8/2011 | Cheng et al. |
| 2012/0190205 A1 | 7/2012 | Clevenger et al. |
| 2014/0287587 A1 | 9/2014 | Lee et al. |
| 2014/0346141 A1* | 11/2014 | Brizard ................. G03F 7/0002 216/49 |
| 2015/0034594 A1* | 2/2015 | Singh ........................ G03F 7/30 216/49 |
| 2015/0064915 A1* | 3/2015 | Wuister ................... H01L 27/11 438/700 |
| 2015/0235839 A1 | 8/2015 | Coskun et al. |
| 2019/0035630 A1* | 1/2019 | Lee ........................ G03F 7/0002 |

OTHER PUBLICATIONS

Lee, Jae-Woo, et al. "Directed Self-Assembly Process and Materials Development." Dongjin Semichem Co., Ltd., Sematech Symposium Korea. vol. 21. 2012, 21 pages.

* cited by examiner

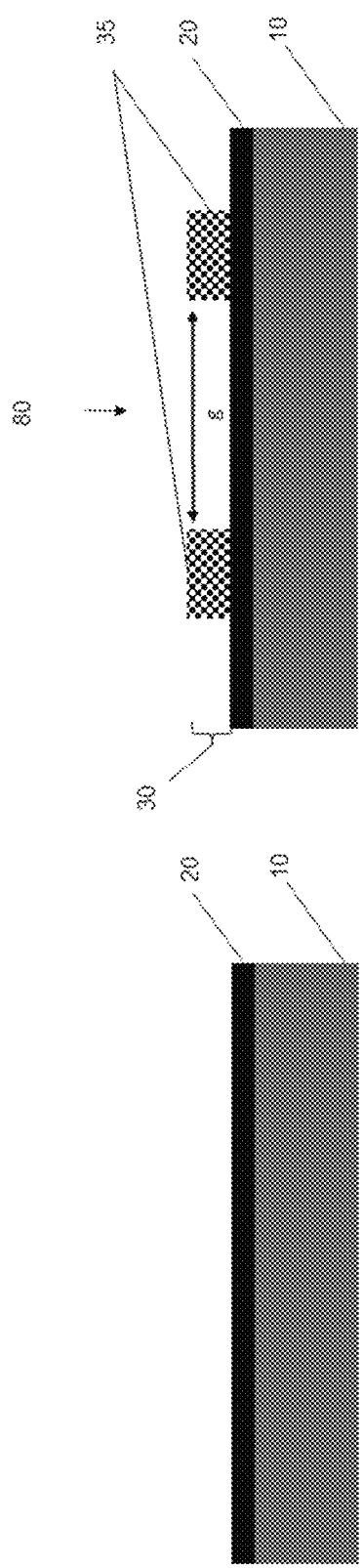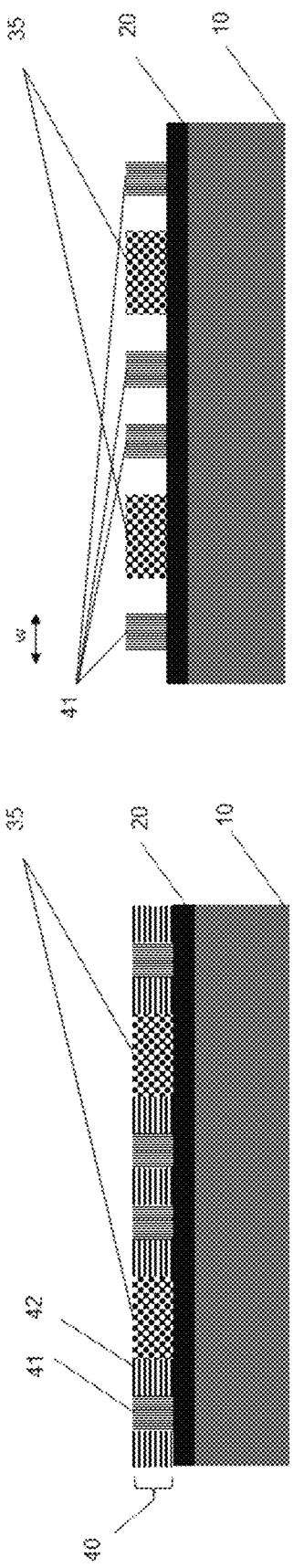

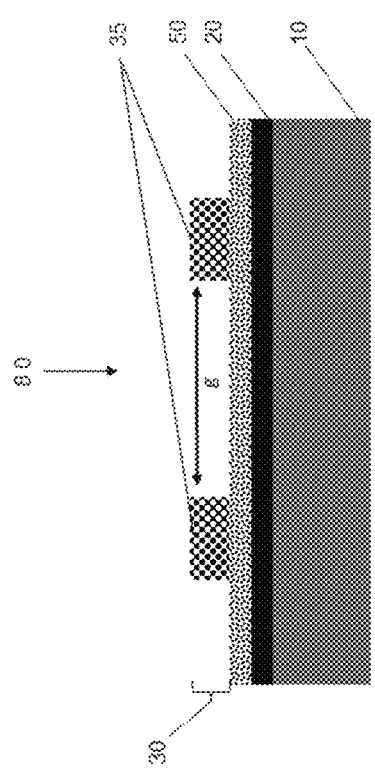
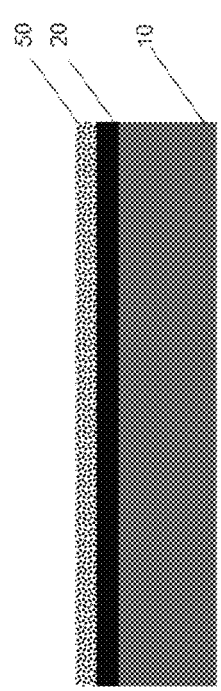
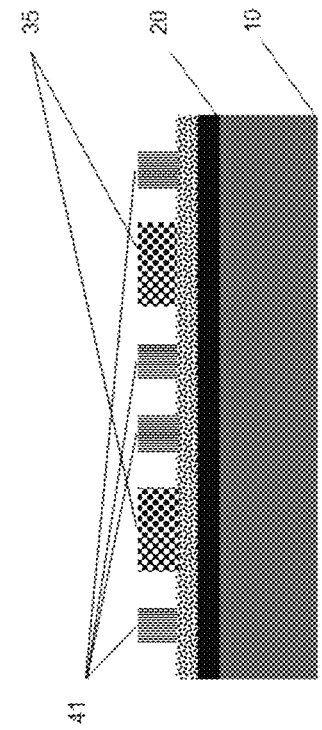
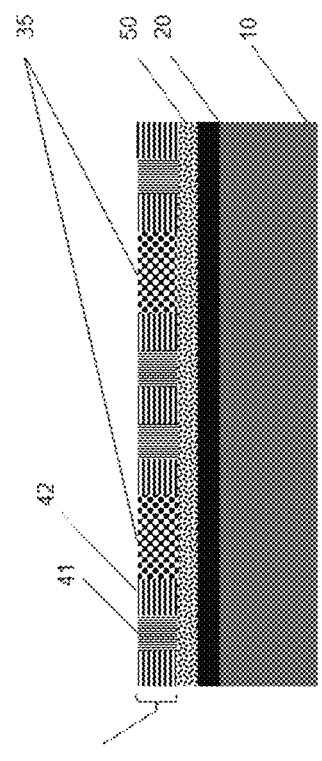
Fig. 2(a)
Fig. 2(b)
Fig. 2(c)
Fig. 2(d)

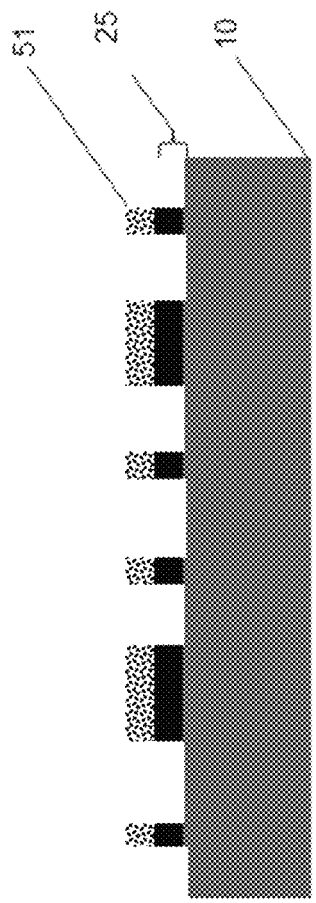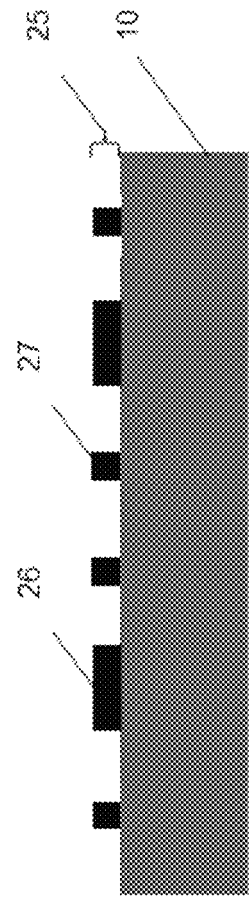

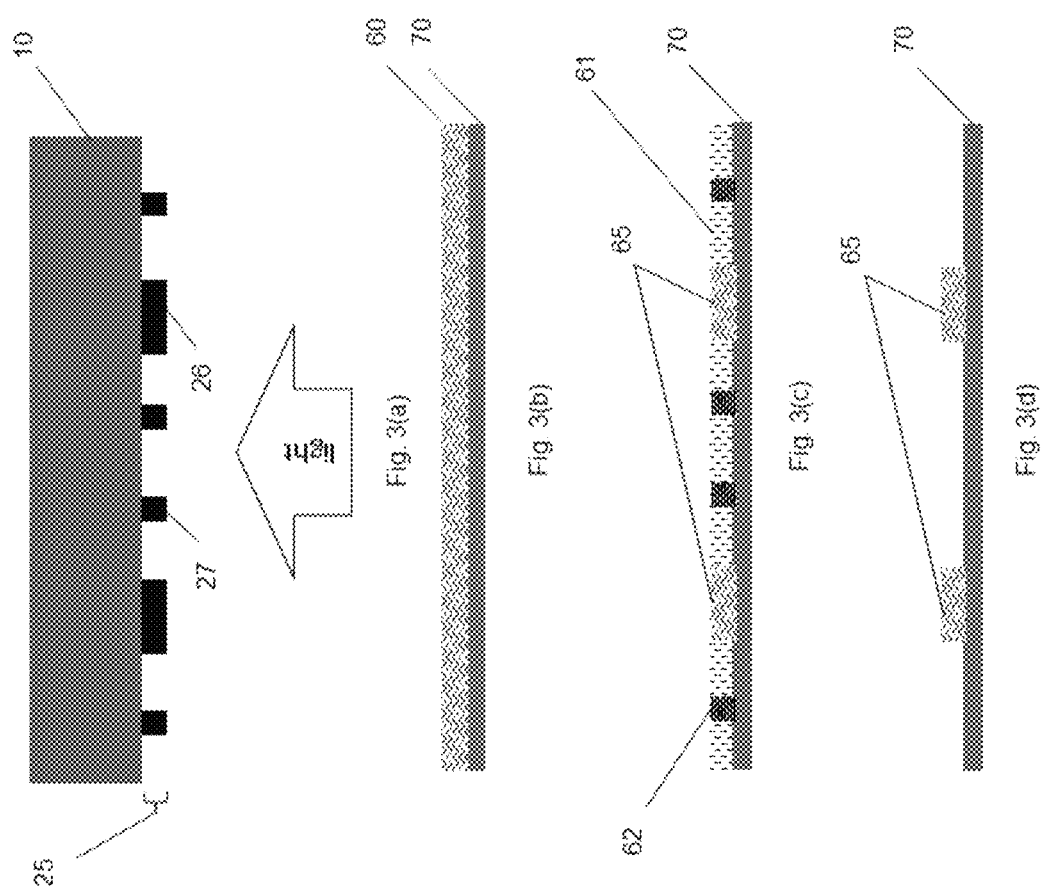

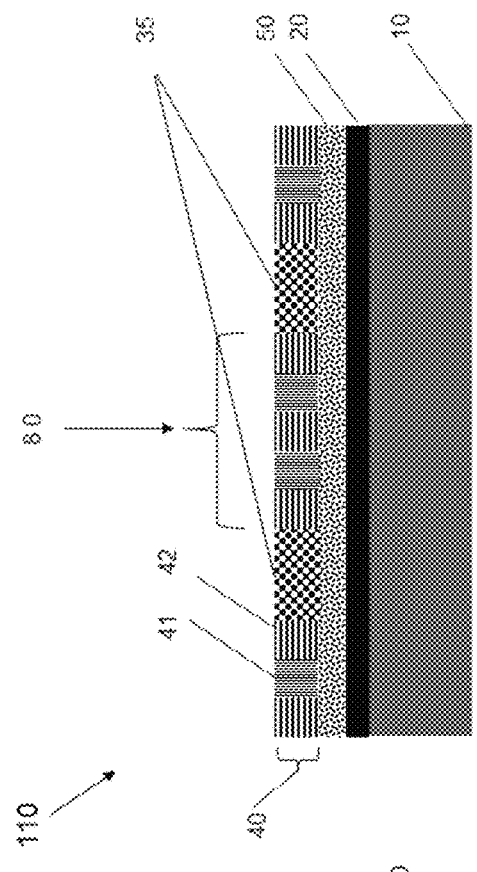
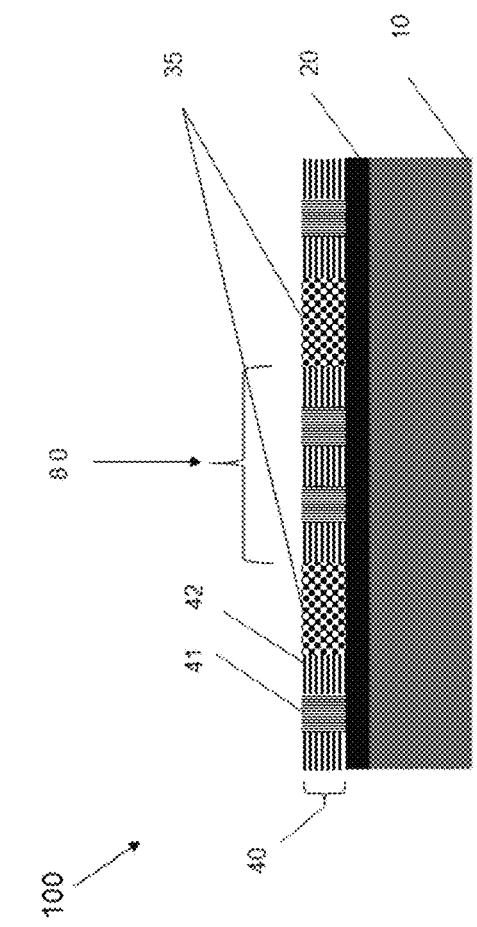

METHOD FOR MANUFACTURING A MASK

CROSS-REFERENCE TO RELATED APPLICATIONS

This application claims priority from European patent application no. 17189717.6, filed Sep. 6, 2017, which is incorporated by reference in their entirety.

TECHNICAL FIELD OF THE DISCLOSURE

The present disclosure is related to the field of lithography. More specifically, it is related to a method for manufacturing a mask.

BACKGROUND OF THE DISCLOSURE

In IC manufacturing, lithography is an essential process step. Due to the continuous reduction in feature sizes, optical proximity correction (OPC) techniques are deployed to calculate what photomask pattern should be deployed to create the desired wafer pattern. The switch to heavily-OPCed patterns is computationally challenging, but also brings certain challenges for masks and their fabrication. Therefore, advanced masks should be fabricated to enable the patterning of reduced feature sizes.

In addition to the main design features, sub resolution assist features (SRAF) are typically present on masks to improve the printability of design features. When the mask is exposed by the light from the source, light is blocked completely by the larger design features. The smaller assist features partially block the light and do not image on the substrate to be patterned. The final substrate pattern can achieve better performance because of these assist features.

Advanced masks require very small features (<10 nm on mask) that are beyond the resolution limits of mask fabrication methods. Adding the small features forces the e-beam patterning systems to generate very small e-beam "shots" that dramatically increase write time in such beams. In order to write these small assist features, they must exist in the mask data and this explodes the data volume—for example—increasing data volume from ~50 Mb at 65 nm logic nodes to over 150 Gb at 7 nm logic nodes. Complex models must be created and calibrated to design and add such small assist features that can make the mask fabrication process quite cumbersome.

Therefore, there is a need in the art for methods to manufacture masks without increasing data volume and/or without increasing write-time on the state-of-the-art scan beams.

SUMMARY OF THE DISCLOSURE

It is an object of the present disclosure to provide an efficient and simple method for manufacturing a mask structure for lithography and a mask structure for lithography manufactured thereof.

It is an advantage of the embodiments of the present disclosure that feature sizes beyond the resolution of the mask manufacturing process are enabled. This provides maintaining a smaller design volume while not increasing the write-time.

It is an advantage of the embodiments of the present disclosure that assist features suitable for EUV masks can be manufactured. It is a further advantage of the embodiments of the present disclosure that assist features having sizes less than 8 nm can be manufactured.

It is a further advantage that the mask data volumes can be significantly smaller.

The above objective is accomplished by a method and a device according to the present disclosure.

In a first aspect, the present disclosure relates to a method for manufacturing a mask structure for a lithography process. The method comprises providing a substrate covered with an absorber layer on a side. A patterned layer may be provided over the absorber layer. The patterned layer comprises at least one opening. At least one assist mask feature may be formed in the at least one opening. The at least one assist mask feature may be formed by performing a directed self-assembly (DSA) patterning process. The DSA patterning process comprises inducing phase separation of a block co-polymer (BCP) material, provided in the at least one opening, into a first component and a second component. The first component may be the at least one assist mask feature and may be periodically distributed with respect to the second component.

It has been realized that using DSA patterning process for the formation of the assist mask feature conveys further the formation of assist features, less than 10 nm for instance, in the absorber layer having smaller sizes, which are beyond the resolution capabilities of the mask manufacturing process. This in turn, can minimize the challenge of increased write-time. Furthermore, since the smaller assist features need not to exist anymore in the mask data, data volume expansion is avoided. Thus, it is an advantage of the embodiments of the present disclosure that the method allows for cost and time efficient manufacturing process for masks for lithography.

In a second aspect, the present disclosure relates to a mask structure for a lithography process. The mask structure may be covered with an absorber layer on a side. A patterned layer may be present over the absorber layer and it comprises at least one opening. There may be at least one assist mask feature in the at least one opening. The at least one assist mask feature may be a first component of a BCP material and may be periodically distributed with respect to a second component of the BCP material.

By such a mask structure, the absorber layer may be protected. This can be advantageous since it avoids the contamination or damaging of the absorber layer where one needs to transport the mask structure to another location or to another process tool after provision and phase separation of the BCP material. Contamination or damage on the absorber layer can jeopardize the pattern fidelity on the absorber layer, thus influencing the actual patterns to be made on a substrate. This can adversely affect the device performance.

Particular aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of masks for lithography in this field, the present concepts are believed to represent substantial new and novel improvements, including departures from prior practices, resulting in the provision of more efficient masks of this nature.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE FIGURES

FIG. 1(a) to FIG. 1(e) shows schematically, according to representative embodiments of the present disclosure, steps of manufacturing a mask, wherein at least one assist mask feature may be formed by performing a Directed Self Assembly (DSA) patterning process FIG. 2(a) to FIG. 2(f) shows schematically, according to representative embodiments of the present disclosure, steps of manufacturing a mask, wherein at least one assist mask feature may be formed by performing a Directed Self Assembly (DSA) patterning process and wherein a neutral layer may be present between the absorber layer and the patterned layer.

FIG. 3(a) to FIG. 3(d) shows schematically, according to representative embodiments of the present disclosure, steps of obtaining a developed photoresist on a layer to be patterned using the mask.

FIG. 4(a) and FIG. 4(b) show schematically, according to representative embodiments of the present disclosure, the mask structure obtained during the process of manufacturing the mask.

DETAILED DESCRIPTION OF THE DISCLOSURE

Figure 1E:
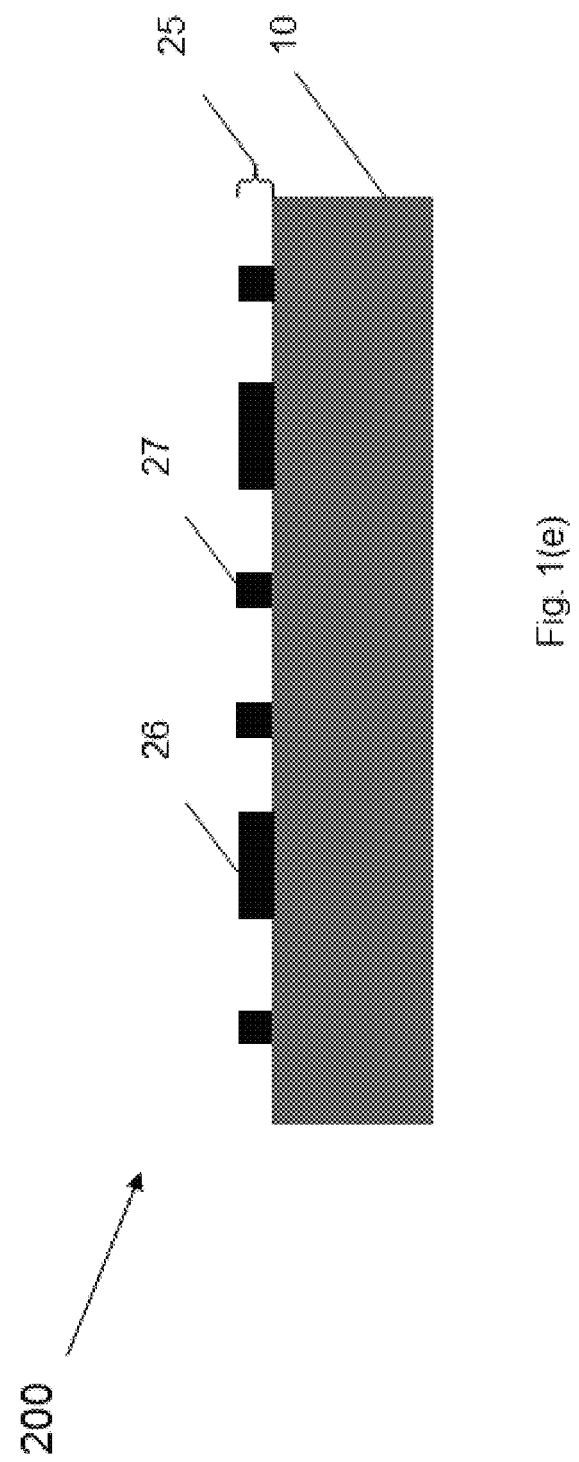

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof.

Reference throughout the specification to "one embodiment", "an embodiment or "some embodiment" means that a particular feature, structure or characteristic described in connection with the embodiment is included in at least one embodiment of the present disclosure. Thus, appearances of the phrases "in one embodiment" or "in an embodiment" in various places throughout the specification are not necessarily all referring to the same embodiment, but may. Furthermore, the particular features, structures or characteristics may be combined in any suitable manner, as would be apparent to one of ordinary skill in the art from the disclosure, in one or more embodiments.

Similarly, it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various aspects. The method of disclosure, however, is not to be interpreted as reflecting an intention that the claimed subject matter requires more features than are expressly recited in each claim. Rather, as the following claims reflect, aspects lie in less than all features of a single foregoing disclosed embodiment. Thus, the claims following the detailed description are hereby expressly incorporated into the detailed description, with each claim standing on its own as a separate embodiment of the disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of the description.

The disclosure will now be described by a detailed description of several embodiments of the disclosure. It is clear that other embodiments of the disclosure can be configured according to the knowledge of persons of ordinary skill in the art without departing from the technical teaching of the disclosure, the disclosure being limited only by the terms of the appended claims.

The method according to the first aspect may be illustrated schematically in FIG. 1(a) to FIG. 1(e). The figures show corresponding cross-sections of the substrate at different stages of the method. Purely to facilitate understanding, different layers are shown with different numbers, however; this should not be construed in any limiting sense.

As used herein and unless provided otherwise, the term "assist mask feature" refers to features that are created by using DSA patterning process, and they are further used as a mask to create the real assist features of the mask for lithography in the absorber layer through etching of the absorber layer.

As used herein and unless provided otherwise, the term "asymmetric BCP material" refers to a BCP material having a composition such that subsequent to phase separation, the width of the component that remains upon selective removal of the complimentary component is smaller than that of the selectively removed component.

As used herein and unless provided otherwise, the term "stripping of neutral layer" refers to cleaning the surface of the substrate, more specifically cleaning the surface of the absorber layer from the neutral layer.

We now refer to FIG. 1(a) to FIG. 1(e).

The method starts with providing a substrate (10) covered with an absorber layer (20) on a side (FIG. 1(a)). The absorber layer absorbs light upon exposure. Thus, the absorber layer absorbs the light during exposure in the lithography tool during the lithography process.

In embodiments, the substrate (10) may be suitable for use in manufacturing a mask for lithography. The substrate (10), may for example, be a quartz substrate. A substrate suitable for patterning for EUV masks or a substrate suitable for another mask requiring complex design may also be used. A patterned layer (30) may be provided over the absorber layer (20) (FIG. 1(b)). The patterned layer (30) comprises at least one opening (80) (FIG. 1(b)). The at least one opening (80) can extend through the complete thickness of the patterned layer (30), thereby creating protrusions (35). These protrusions (35) of the patterned layer (30) will form the main features of the mask when transferred into the absorber layer (20). These protrusions (35) may be separated from each other by a separation distance (g). In other words, the width of the opening (80) equals this separation distance (g). In embodiments, the separation, g, between the protrusions (35) may be larger than the natural periodicity $L_0$ of the BCP material. The separation, g, may be in the range of 5 nm to 50 nm.

In embodiments, the patterned layer (30) may be a patterned photoresist layer. The patterned photoresist layer may be obtained by providing a layer of photoresist on the absorber layer and exposing the substrate in a lithography tool such that the photoresist layer is patterned. The patterned layer being the patterned photoresist layer is advantageous since it provides one patterning step for the patterning of the absorber layer, thus making the mask manufacturing process cost efficient. Furthermore, the photoresist layer may be compatible with standard mask processing standards thus, making it imaged easily, thanks to its photosensitivity, with conventional pattern generators used in the fabrication of masks, thereby obtaining the patterned photoresist layer.

In embodiments, the patterned layer may be a patterned spin-on-carbon layer (SOC). SOC layers are, typically, used as template material when performing DSA patterning processes.

In alternative embodiments, the patterned layer (30) may be a hard mask layer. Even though further deposition, lithography and etching steps may need to be introduced to obtain such a patterned layer (30), it will function as a guide layer when the BCP material is provided.

At least one assist mask feature (41) may be formed in the at least one opening (80). The at least one assist mask feature (41) may be formed by performing a Directed Self Assembly (DSA) patterning process. The performing of DSA patterning process comprises providing a BCP material (40) in the at least one opening (80) and inducing phase separation of the BCP material (40) (FIG. 1(c)), by performing an appropriate anneal process, into a first component (41) and a second component (42). The main features can act as guide pattern for DSA patterning process. Inducing phase separation of the BCP material (40) leads the first component (41) to be periodically distributed with respect to the second component (42). The first component (41) becomes the at least one assist mask feature and may be periodically distributed with respect to the second component (42) in the at least opening (80). By performing DSA patterning process for the formation of assist mask features, one can tailor the size of these assist mask features. This is advantageous due to fact that while features' sizes are shrinking in semiconductor industry in order to keep up with the well-known Moore's Law, assist features that are used for the creation of such shrunk features are also shrinking. Mask patterning for lithography typically begins to fail around 50 nm using e-beam technologies. Thus, making assist features can become almost impossible to pattern at advanced nodes. Thus, DSA patterning process provides the resolution of assist feature sizes that are not possible with the conventional mask fabrication methods, such as e-beam technologies. In addition, DSA patterning process offer the potential to extend the patterning options in the mask manufacturing for lithography and particularly for EUV mask manufacturing. Furthermore, smaller size assist features can now be created by using DSA patterning process. Therefore, increased write-time that is experienced by the conventional e-beam patterning, which is used to pattern smaller size features including smaller size assist features on a mask, is no longer a challenge. Using DSA patterning process also avoids the explosion of the data volume, thus making the cost of mask manufacturing lower and speed of manufacturing faster. Furthermore, using DSA patterning process provides simpler optical proximity correction (OPC) because the material itself embodies the rules for creating features no additional computational operations on the base design are needed to generate and place the assist features. In embodiments, the BCP material may be, but not limited to, a PS-PMMA block co-polymer. In alternative embodiments, a high-chi block co-polymer material may also be used.

In embodiments, the at least one opening (80) may be a trench.

When the at least one opening (80) is a trench, the protrusions (35) of the patterned layer (30) forming the patterned layer (30) may be unconnected and separated independently from each other.

When the at least one opening (80) is a trench, the first component and the second component of the BCP material may be in the form of a lamellar structure. The width of the trench may be defined by the gap, g, between the protrusions (35). The ratio of the first component to the second component of the BCP material may be arranged such that the lamellar structure is obtained in the trench. In this lamellar structure, the first and the second component are aligned adjacent to each other in a horizontal direction starting from a first sidewall of the trench and extending to a second sidewall of the trench facing the first sidewall. Thus, they may be parallel to each other and to the trench, horizontally. The width of the trench may have different widths adapted for the composition of the BCP material used such that the natural periodicity, $L_0$, of the BCP material commensurate with the width of the trench and the lamellar structure can, thereby, be obtained.

In embodiments, the at least one opening may be a hole, having a circular, a rectangular, an elliptical or a square shape (not shown in the figures).

When the at least one opening (80) is a hole, the protrusions (35) of the patterned layer (30) forming the patterned layer (30) may be connected. The hole may have different dimensions adapted for the type of the BCP material used such that Lo of the BCP material commensurate with the dimensions of the hole.

When the at least one opening (80) is a hole, the periodic distribution of the first component with respect to the second component may be such that the first component may be in the form of a cylindrical structure surrounded by the second component. The dimension of the hole may arranged according to the composition of the BCP material such that the first component may be formed in the form a cylindrical structure. Depending on the dimension of the opening, the number of cylindrical structure may be more than one and separated at a pre-determined distance away from neighboring cylinders. The cylindrical structures may be formed such that they stand perpendicular with respect to the side of the substrate (10) covered with the absorber layer (20).

Selective removal of the second component (42) can result in the first component (41) to remain in the at least one opening (80) to form the at least one assist mask feature (41). If the first component (41) and the second component (42) are in the form of a lamellar structure, after selective removal, the first component (41) may then be in the form of line and space assist mask features. If the first component (41) is in the form of a cylindrical structure surrounded by the second component (42), after selective removal, the first component (41) may then be in the form of cylinder and space assist mask features.

The DSA patterning process may further comprise selectively removing the second component (42) with respect to the first component (41) (FIG. 1(d)). Following selective removal of the second component (42), the method may further comprise patterning the absorber layer (20) using the patterned layer (30) and the at least one assist mask feature (41) as a mask, thereby obtaining a patterned absorber layer (25). Patterning the main features and assist features together at the same time on the absorber layer (20) can provide a combined advantage of being able to create smaller assist feature sizes and providing a simplified mask manufacturing process in addition to providing a lower cost and a faster mask manufacturing process.

The patterned absorber layer (25) comprises main features (26) and assist features (27). Assist features of less than 10 nm can be obtained by being able to adjust the critical dimension (CD) of the first component (41). This CD is equal, in other words, to the width (w) of the first component (41) if it is in the form of a lamellar structure, or equal to the diameter if it is in the form of a cylinder, due to the type of the BCP material used and to the DSA patterning process.

In embodiments, the DSA patterning process may further comprise, subsequent to the induction of phase separation, selectively infusing a metal or a ceramic material into the first component through Sequential Infiltration Synthesis (SIS) process. Performing a SIS process typically comprises pulsing a first precursor and a second precursor onto the substrate. The first precursor may typically be a metal-containing precursor that binds selectively with the first component (41). Second precursor may typically be an oxygen-containing precursor that can facilitate the formation of the ceramic material by interacting with the metal bound to the first component (41). This can further help to improve the Line Width Roughness of the assist features (27) when the assist mask features (41) are transferred into the absorber layer (20). Improvement of the LWR of the assist mask features (41) may be a way of quantifying variability in the manufacturing of the mask structure. Improved LWR of the assist mask features (41) can be an indication of improved LWR of the main features that will be obtained when the protrusions (35) are transferred into the absorber layer (20). This can be advantageous since it is these main features on the absorber layer that can be printed on a substrate to-be-patterned when the mask structure is used for a lithography process.

Following the SIS process, the DSA process may, in embodiments, further comprise selectively removing the second component (42) of the BCP material.

In embodiments, a neutral layer (50) may be present in contact with and sandwiched between the absorber layer (20) and the patterned layer (30). (FIG. 2(b)) The neutral layer (50) may be provided on the substrate (10) before providing the patterned layer (30) (FIG. 2(a)). The neutral layer (50) may be added to control interactions of the components of the BCP material. This can provide the surface energy that is appropriate for inducing pattern formation in the BCP material. The neutral under layer (50) could also serve as a hard mask for pattern transfer. The neutral layer can be typically a cross-linked neutral layer.

The provision of the BCP material (40) in the at least one opening (80) (FIG. 2(c)) and inducing phase separation of the BCP material (40) (FIG. 2(c)) into a first component (41) and a second component (42) by performing an appropriate anneal process may be comprised in the performing of the DSA patterning process, in embodiments where the neutral layer is present in contact and sandwiched between the absorber layer (20) and the patterned layer (30). The DSA patterning process, in these embodiments, can also comprise removing selectively the second component (42) with respect to the first component (41) (FIG. 2(d)). Following selective removal of the second component (42), the method may further comprise patterning the absorber layer (20) using the patterned layer (30) and the at least one assist mask feature (41) as a mask (FIG. 2(e)). The method, in these embodiments, may further comprise stripping away the neutral layer (50), thereby obtaining a patterned absorber layer (25) (FIG. 2(f)).

DSA patterning process may induce specific defects modes such as dislocation or disclination defects.

In embodiments, the BCP material may be asymmetric. The asymmetry of the BCP material is a function of how the components (41; 42) of the BCP material are mixed; i.e. composition or the formulation of the BCP material. Dislocation defects that may form in the component of the BCP material that is selectively removed (42) may, thus, be minimized by making the BCP material asymmetric. Making BCP material asymmetric can result in having more of the component of the BCP material that will be selectively removed (42) compared to the component that will remain and form the assist mask features (41). In cases where assist mask features (41) are larger than the printing threshold or if they are bridged with each other, this can pose problems for the ultimate function of the assist features in absorber layer (20) since they will print instead of merely improving the printability of the main features as intended. Thus, by employing an asymmetric BCP material, which is obtainable by adjusting its formulation such that the width of the first component (41) is narrower than the second component (42), which will be selectively removed, such problems of bridging of or broader assist mask features can be avoided. If there are defects, they can result in assist features (27) in the patterned absorber layer (25) that are smaller than design intent and in isolated instances, do not pose a printing concern.

FIG. 3(a) to FIG. 3(d) schematically shows how the mask (200) may be used in a lithography process of semiconductor manufacturing. A positive resist may be used in this schematic illustration. The mask (200) including the patterned absorber layer may be held facing a surface of a substrate (70) (FIG. 3(a)) that is to be patterned and may be exposed by light having either deep UV wavelength or EUV wavelength or any other wavelength suitable to carry out a patterning process by lithography process (FIG. 3(b)). The substrate (70) may comprise a single layer or multiple layers, which may be patterned or blanket layers. The surface of the substrate (70) may be covered by a photoresist layer (60) suitable for the lithography process (FIG. 3(b)). Light may be blocked completely by the main features (26). The smaller features, which are the assist features (27), only partially block the light and thus, do not image on the substrate (70) as indicated slightly (62). Regions (61) of the photoresist layer (60) may be completely exposed. After photoresist development, patterned photoresist features (65) may be formed on the substrate (70) (FIG. 3(d)).

In a second aspect, the present disclosure relates to a mask structure (100; 110) for a lithography process (FIG. 4(a); FIG. 4(b)). The mask structure (100; 110) comprises a substrate covered with an absorber layer (20) on a side. A patterned layer may be present over the absorber layer (20). The patterned layer comprises at least one opening (80). The at least one opening (80) extends through the complete thickness of the patterned layer, thereby creating protrusions (35). There may be at least one assist mask feature (41) in the at least one opening (80). The at least one assist mask feature (41) may be a first component of a BCP material and may be periodically distributed with respect to a second component (42) of the BCP material.

In embodiments, the mask structure, the substrate, the patterned layer, the at least one assist mask feature may independently be according to any embodiment of the first aspect.

Such a mask structure (100; 110) can protect the absorber layer (20). This is due to the fact that the absorber layer (20) is covered. This can be advantageous since it avoids the contamination or damaging of the absorber layer where one needs to transport the mask structure to another location or to another process tool after provision and phase separation of the BCP material. Contamination or damage on the absorber layer can jeopardize the pattern fidelity on the absorber layer, thus influencing the actual patterns to be made on a substrate. This can adversely affect the device performance.

In embodiments, the patterned layer may be a patterned photoresist layer.

In embodiments, the BCP material may be asymmetric.

Asymmetric BCP material, due to its composition, may have a first component with smaller values for its width compared to the second component. Thus, smaller size assist features can be made in the absorber layer (20), when a mask structure (110) comprising an asymmetric BCP material is used. With such a mask structure (110), masks for EUV lithography can be manufactured, whereby assist features having CD values smaller than 10 nm are obtained. Furthermore, such a mask structure (110) may be not only useful for manufacturing masks for EUV lithography but also for manufacturing masks that employ complex designs, whereby feature sizes of widths of less than 10 nm need to be present in the absorber layer. Such features may be line-shaped features separated by spaces or hole-shaped or pillar shaped features.

In embodiments, the mask structure (110) may further comprise a neutral layer (50) in contact and sandwiched between the absorber layer (20) and the patterned layer. It may be advantageous to have the neutral layer due to the fact that such a mask structure (110) may be taken to an etch tool to remove selectively the second component (42) of the BCP material. After removal of the second component (42), the pattern may be transferred into the neutral layer (50) and into the absorber layer (20). Typically, a wet etch process can provide better selectivity when removing the second component (42) with respect to the first component (41). For example, when PS-PMMA block co-polymer is used, PMMA can be selectively removed by using a wet etching solution comprising acetone. However, in some embodiments, pattern transfer into the neutral layer (50) and further into the absorber layer (20) may be carried out by a dry etching process to avoid pattern collapse due to the capillary forces that may be induced in case wet etching is used. Thus, the mask structure (110) may need to be transferred from the process tool where wet etch takes place for the selective removal of the second component (42) to a dry etch process tool for further pattern transfer into the neutral layer (50) and the absorber layer (20). It is during this transfer between different processes that the neutral layer (50) can protect the absorber layer (20) against contamination or damage by covering it.

The invention claimed is:

1. A method for manufacturing a mask structure for a lithography process, the method comprising:
    providing a substrate covered with an absorber layer on a side thereof;
    providing a patterned layer over the absorber layer, the patterned layer comprising at least one opening; and
    forming at least one assist mask feature in the at least one opening;
    wherein the at least one assist mask feature is formed by performing a directed self-assembly (DSA) patterning process comprising providing a block co-polymer (BCP) material in the at least one opening and inducing phase separation of the BCP material into a first component and a second component, the first component being the at least one assist mask feature and being periodically distributed with respect to the second component.

2. The method according to claim 1, wherein the patterned layer is a patterned photoresist layer.

3. The method according to claim 1, wherein the patterned layer is a patterned spin-on-carbon layer.

4. The method according to claim 1, wherein performing the DSA patterning process further comprises selectively removing the second component of the BCP material.

5. The method according to claim 4, further comprises patterning the absorber layer by using the patterned layer and the at least one assist mask feature as a mask.

6. The method according to claim 1, wherein performing the DSA patterning process further comprises, subsequent to the induction of phase separation, selectively infusing a metal or ceramic material into the first component.

7. The method according to claim 1, wherein a neutral layer is in contact with and sandwiched between the absorber layer and the patterned layer.

8. The method according to claim 1, wherein the at least one opening is a trench.

9. The method according to claim 8, wherein the first component and the second component are in the form of a lamellar structure.

10. The method according to claim 1, wherein the at least one opening is a hole having a circular, a rectangular, an elliptical or a square shape.

11. The method according to claim 10, wherein the first component is in the form of a cylindrical structure surrounded by the second component.

12. The method according to claim 1, wherein the BCP material is asymmetric.

13. The method according to claim 1, wherein the BCP material is a PS-PMMA block co-polymer or a high-chi block co-polymer.

14. A mask structure for a lithography process, comprising:
    a substrate covered with an absorber layer on a side thereof;
    a patterned layer over the absorber layer, the pattern layer comprising at least one opening; and
    at least one assist mask feature in the at least one opening, the at least one assist mask feature being a first component of a BCP material and being periodically distributed with respect to a second component of the BCP material.

15. The mask structure according to claim 14, wherein the patterned layer is a patterned photoresist layer.

16. The mask structure according to claim 14, wherein the BCP material is asymmetric.

17. The mask structure according to claim 14, wherein the mask structure further comprises a neutral layer in contact and sandwiched between the absorber layer and the patterned layer.

18. The mask structure according to claim 14, wherein the BCP material is a PS-PMMA block co-polymer or a high-chi block co-polymer.

19. The mask structure according to claim 14, wherein the at least one opening is a trench.

20. The mask structure according to claim 14, wherein the first component and the second component are in the form of a lamellar structure.

* * * * *